(12) United States Patent
Maruyama et al.

(10) Patent No.: US 7,977,442 B2
(45) Date of Patent: Jul. 12, 2011

(54) RADIATION-SENSITIVE COMPOSITION, POLYMER AND MONOMER

(75) Inventors: Ken Maruyama, Tokyo (JP); Daisuke Shimizu, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 12/875,133

(22) Filed: Sep. 3, 2010

(65) Prior Publication Data

US 2010/0331440 A1    Dec. 30, 2010

Related U.S. Application Data

(63) Continuation of application No. PCT/JP2009/053735, filed on Feb. 27, 2009.

(30) Foreign Application Priority Data

| Mar. 4, 2008 | (JP) | 2008-054099 |
| Aug. 19, 2008 | (JP) | 2008-211089 |

(51) Int. Cl.
| C08F 222/20 | (2006.01) |
| C07C 69/593 | (2006.01) |
| G03C 1/73 | (2006.01) |
| C08F 4/04 | (2006.01) |

(52) U.S. Cl. .............. 526/323.1; 526/282; 526/313; 526/323.2; 560/190; 522/113; 430/270.1
(58) Field of Classification Search .............. 526/313, 526/323.1, 282, 332.3; 522/182, 113; 430/286.1, 430/270.1; 560/220, 224, 190
See application file for complete search history.

(56) References Cited

U.S. PATENT DOCUMENTS

| 5,561,194 | A | 10/1996 | Cornett et al. |
| 6,492,086 | B1 | 12/2002 | Barclay et al. |
| 6,576,787 | B1 * | 6/2003 | Nakano et al. ............. 560/220 |
| 7,179,578 | B2 | 2/2007 | Sato et al. |
| 7,186,495 | B2 | 3/2007 | Maeda et al. |
| 7,202,010 | B2 | 4/2007 | Yamada et al. |
| 7,700,256 | B2 | 4/2010 | Barclay et al. |
| 2003/0054286 | A1 * | 3/2003 | Sato et al. ............. 430/270.1 |

FOREIGN PATENT DOCUMENTS

| JP | 10-171122 | * | 6/1998 |
| JP | 2000-026446 | | 1/2000 |
| JP | 2000-229898 | | 8/2000 |
| JP | 2000-321772 | | 11/2000 |
| JP | 2000-321772 A | * | 11/2000 |
| JP | 2001-166474 | | 6/2001 |
| JP | 2001-166478 | | 6/2001 |
| JP | 2001-194792 | | 7/2001 |
| JP | 2002-303978 | | 10/2002 |
| JP | 2003-107708 | | 4/2003 |

OTHER PUBLICATIONS

Machine Translation of JP 10-171122; publication date: Jun. 1998.*
Machine Translation of JP 2000-321772A; publication date: Nov. 2000.*
International Search Report for International Application No. PCT/JP2009/053735, Mar. 24, 2009.
Written Opinion of the International Searching Authority (w/ International Preliminary Report) for International Application No. PCT/JP2009/053735, Oct. 12, 2010.

* cited by examiner

*Primary Examiner* — Fred M Teskin
(74) *Attorney, Agent, or Firm* — Ditthavong Mori & Steiner, P.C.

(57) ABSTRACT

A polymer includes a repeating unit shown by a general formula (1) in which $R^1$ represents a hydrogen atom or a methyl group, $R^2$ represents a substituted or unsubstituted linear or branched monovalent alkyl group having 1 to 20 carbon atoms, an alicyclic group having 3 to 25 carbon atoms, or an aryl group having 6 to 22 carbon atoms, and X represents a substituted or unsubstituted methylene group or a substituted or unsubstituted linear, branched or alicyclic hydrocarbon group having 2 to 25 carbon atoms. The polymer has a polystyrene-reduced weight average molecular weight determined by gel permeation chromatography (GPC) of 3000 to 100,000.

6 Claims, 2 Drawing Sheets

US 7,977,442 B2

RADIATION-SENSITIVE COMPOSITION, POLYMER AND MONOMER

CROSS-REFERENCE TO RELATED APPLICATIONS

The present application is a continuation application of International Application No. PCT/JP2009/053735, filed Feb. 27, 2009, which claims priority to Japanese Patent Application No. 2008-054099, filed Mar. 4, 2008, and Japanese Patent Application No. 2008-211089, filed Aug. 19, 2008. The contents of these applications are incorporated herein by reference in their entirety.

BACKGROUND OF THE INVENTION

1. Technical Field

The present invention relates to a polymer, a radiation-sensitive composition, and a monomer.

2. Background Art

A semiconductor device (e.g., IC and LSI) production process has utilized microfabrication by means of lithography using a photoresist composition. Along with an increase in the degree of integration of integrated circuits, it has become necessary to form a sub-micron or quarter-micron fine pattern. Therefore, i-lines, KrF excimer laser light, or ArF excimer laser light having a short exposure wavelength has been used instead of g-lines. Lithography that utilizes electron beams, X-rays, or EUV light instead of excimer laser light has also been developed.

Lithography that utilizes electron beams or EUV light is considered to be next-generation or third-generation patterning technology, and requires a positive-tone resist that exhibits high sensitivity and high resolution. In particular, it is very important to achieve an increase in sensitivity in order to reduce the wafer processing time. However, when increasing the sensitivity of a positive-tone resist that is used for electron beams or EUV light, a deterioration in resolution and nano edge roughness occurs. Therefore, development of a resist that achieves these properties in combination has been strongly desired. Note that the term "nano edge roughness" refers to a phenomenon in which the edge of the resist pattern irregularly changes with respect to the substrate in the direction perpendicular to the line direction due to the properties of the resist, so that a difference occurs between the design dimensions and the actual pattern dimensions when viewed from above. The difference from the design dimensions is transferred by etching using the resist as a mask, and causes a deterioration in electrical properties. As a result, yield decreases. In particular, it is very important to improve the nano edge roughness when forming a fine pattern having a line width of 0.25 μm or less. High sensitivity, high resolution, an excellent pattern shape, and a small degree of nano edge roughness have a trade-off relationship. It is very important to achieve these properties at the same time.

It is also important to achieve high sensitivity, high resolution, an excellent pattern shape, and a small degree of nano edge roughness at the same time when using lithography that utilizes KrF excimer laser light.

As a resist that is suitable for a lithographic process that utilizes KrF excimer laser light, electron beams, or EUV light, a chemically-amplified resist that utilizes an acid catalytic reaction has been mainly used from the viewpoint of increasing sensitivity. As a positive-tone resist, a chemically-amplified resist composition that mainly includes a phenolic polymer (phenolic acid-dissociable polymer) that is insoluble or scarcely soluble in an alkaline solution, but becomes soluble in an alkaline solution due to an acid, and an acid generator, has been effectively used.

A resist composition that include a phenolic acid-dissociable polymer obtained by copolymerizing acid-dissociable acrylate monomers, and a compound (sulfonic acid generator) that generates sulfonic acid upon irradiation of active rays or radiation, has been known as such a positive-tone resist. For example, U.S. Pat. No. 5,561,194, Japanese Patent Application Publication (KOKAI) No. 2001-166474, Japanese Patent Application Publication (KOKAI) No. 2001-166478, Japanese Patent Application Publication (KOKAI) No. 2003-107708, and Japanese Patent Application Publication (KOKAI) No. 2001-194792 disclose such positive-tone resist compositions.

SUMMARY OF THE INVENTION

According to one aspect of the present invention, a polymer includes a repeating unit shown by a general formula (1). The polymer has a polystyrene-reduced weight average molecular weight determined by gel permeation chromatography (GPC) of 3000 to 100,000.

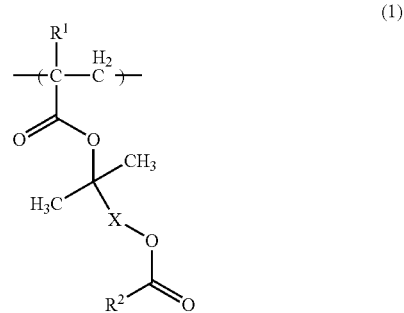

(1)

wherein $R^1$ represents a hydrogen atom or a methyl group, $R^2$ represents a substituted or unsubstituted linear or branched monovalent alkyl group having 1 to 20 carbon atoms, an alicyclic group having 3 to 25 carbon atoms, or an aryl group having 6 to 22 carbon atoms, and X represents a substituted or unsubstituted methylene group or a substituted or unsubstituted linear, branched or alicyclic hydrocarbon group having 2 to 25 carbon atoms.

According to another aspect of the present invention, a radiation-sensitive composition includes an acid-dissociable group-containing polymer and a photoacid generator. The acid-dissociable group-containing polymer is insoluble or scarcely soluble in alkali and converted into alkali-soluble by an action of an acid. The acid-dissociable group-containing polymer includes the above-described polymer.

According to the other aspect of the present invention, a monomer is shown by a general formula (M-1),

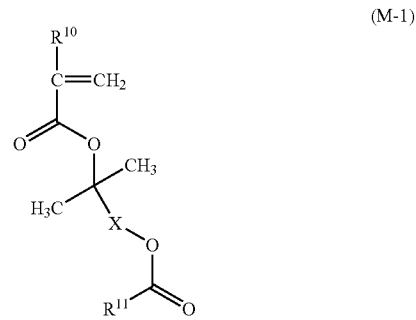

(M-1)

wherein $R^{10}$ represents a hydrogen atom or a methyl group, $R^{11}$ represents a substituted or unsubstituted linear or branched monovalent alkyl group having 1 to 20 carbon atoms, an alicyclic group having 3 to 25 carbon atoms, or an aryl group having 6 to 22 carbon atoms, and X represents a substituted or unsubstituted methylene group or a substituted or unsubstituted linear, branched or alicyclic hydrocarbon group having 2 to 25 carbon atoms.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
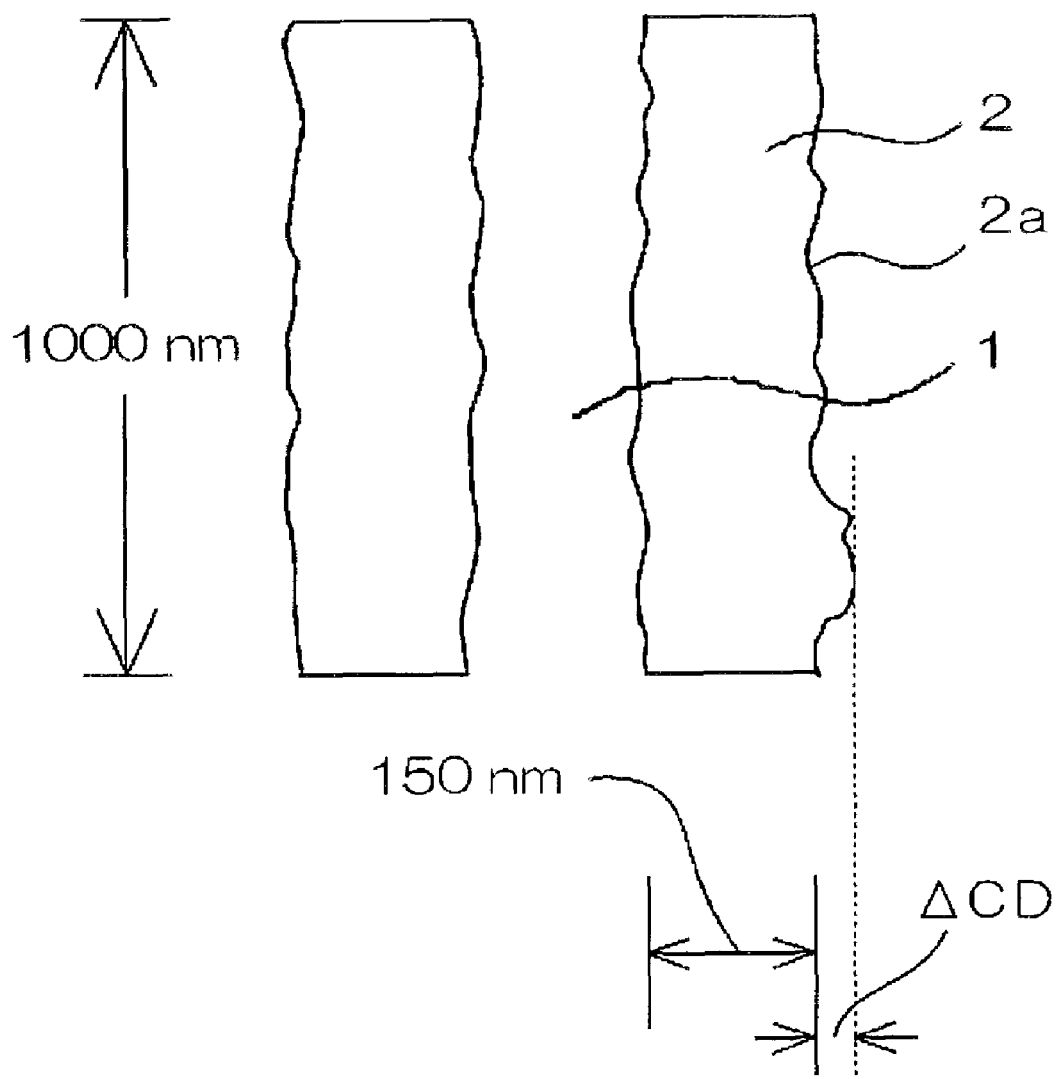
FIG. 1 is a plan view schematically showing a line pattern.

The embodiments will now be described with reference to the accompanying drawings, wherein like reference numerals designate corresponding or identical elements throughout the various drawings.

[1] Polymer

A polymer (hereinafter may be referred to as "polymer (I)") according to one embodiment of the invention includes a repeating unit shown by the following general formula (1) (hereinafter may be referred to as "repeating unit (1)").

The polymer (I) is insoluble or scarcely soluble in alkali, but becomes readily soluble in alkali due to an acid, and may be suitably used as an acid-dissociable group-containing polymer for a radiation-sensitive composition.

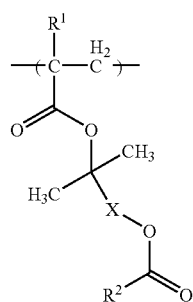

(1)

wherein $R^1$ represents a hydrogen atom or a methyl group, $R^2$ represents a substituted or unsubstituted linear or branched monovalent alkyl group having 1 to 20 carbon atoms, an alicyclic group having 3 to 25 carbon atoms, or an aryl group having 6 to 22 carbon atoms, and X represents a substituted or unsubstituted methylene group or a substituted or unsubstituted linear, branched or alicyclic hydrocarbon group having 2 to 25 carbon atoms.

The number of carbon atoms of the alkyl group represented by $R^2$ in the general formula (1) is 1 to 20, preferably 1 to 16, more preferably 1 to 12, and still more preferably 1 to 8. Specific examples of the alkyl group include a methyl group, an ethyl group, a propyl group, a butyl group, a hexyl group, an octyl group, and the like. The alkyl group may be linear or branched. The alkyl group may be substituted. Specific examples of the substituent include a hydroxyl group, a carboxyl group, a halogen atom (e.g., fluorine atom and bromine atom), an alkoxy group (e.g., methoxy group, ethoxy group, propoxy group, and butoxy group), an alkyloxycarbonyl group, and the like.

The alicyclic site of the alicyclic group having 5 to 25 carbon atoms represented by $R^2$ may be monocyclic or polycyclic. The alicyclic site may be bridged. Specific examples of the alicyclic structure include structures shown by the following formulas (a-1) to (a-50), and the like.

(a-1)

(a-2)

(a-3)

(a-4)

(a-5)

(a-6)

(a-7)

(a-8)

(a-9)

(a-10)

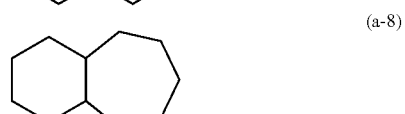

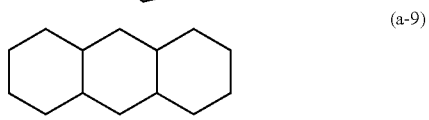

(a-11)

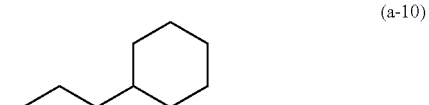

(a-12)

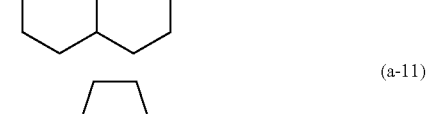

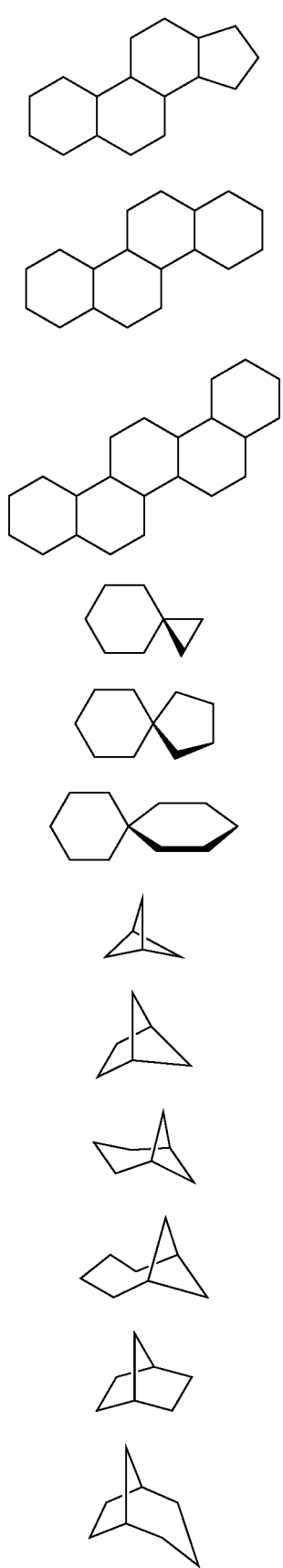
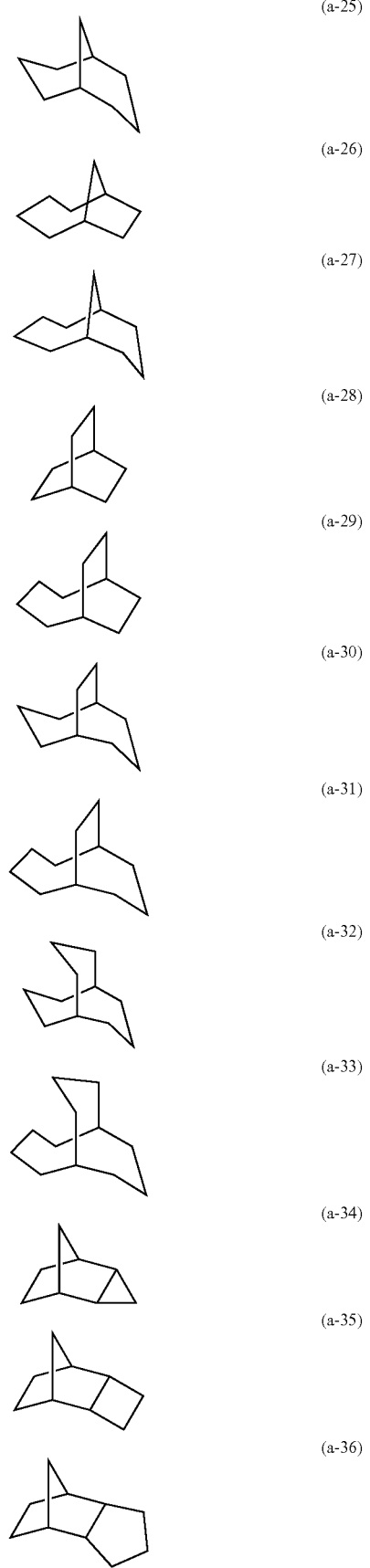

(a-37) 

(a-38) 

(a-39) 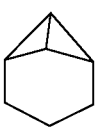

(a-40) 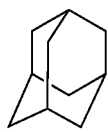

(a-41) 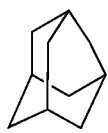

(a-42) 

(a-43) 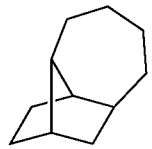

(a-44) 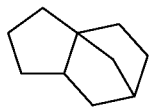

(a-45) 

(a-46) 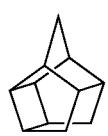

(a-47) 

(a-48) 

(a-49) 

(a-50) 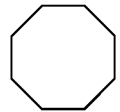

The number of carbon atoms of the alicyclic group is 5 to 25, preferably 6 to 20, and more preferably 7 to 15.

Specific examples of the alicyclic group include an adamantyl group, a noradamantyl group, a decalin residue (decalinyl group), a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. Among these, an adamantyl group, a decalin residue, a norbornyl group, a cedrol group, a cyclohexyl group, a cycloheptyl group, a cyclooctyl group, a cyclodecanyl group, and a cyclododecanyl group are preferable. The alicyclic group is particularly preferably a cycloalkyl group having 7 to 15 carbon atoms.

Note that the alicyclic group may be substituted. Specific examples of the substituent include a hydroxyl group, a carboxyl group, a halogen atom (e.g., fluorine atom and bromine atom), an alkoxy group (e.g., methoxy group, ethoxy group, propoxy group, and butoxy group), an alkyloxycarbonyl group, and the like.

Examples of the aryl group having 6 to 22 carbon atoms represented by $R^2$ include groups derived from structures shown by the following formulas (x-1) to (x-3), and the like. When $R^2$ represents a group (i.e., naphthyl group) derived from the structure shown by the formula (x-2), $R^2$ may be bonded at the 1-position or the 2-position. When $R^2$ represents a group (i.e., anthryl group) derived from the structure shown by the formula (x-3), $R^2$ may be bonded at the 1-position, the 2-position, or the 9-position.

The aryl group may be substituted. Specific examples of the substituent include a methyl group, an ethyl group, a hydroxyl group, a carboxyl group, a halogen atom (e.g., fluorine atom, chlorine atom, and bromine atom), an alkoxy group (e.g., methoxy group, ethoxy group, propoxy group, and butoxy group), an alkyloxycarbonyl group, and the like.

(x-1) 

(x-2) 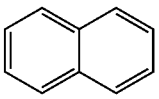

(x-3) 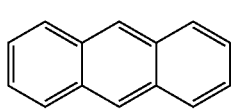

The linear, branched or alicyclic hydrocarbon group having 2 to 25 carbon atoms represented by X in the general formula (1) is preferably an ethylene group, a propylene group, a group derived from any of the structures shown by the formulas (a-1) to (a-50), or the like.

X in the general formula (1) is particularly preferably a methylene group, an ethylene group, a propylene group, or a group derived from the structure shown by the formula (a-48).

The methylene group or the hydrocarbon group represented by X may be substituted. Specific examples of the substituent include a hydroxyl group, a carboxyl group, a halogen atom (e.g., fluorine atom and bromine atom), an alkoxy group (e.g., methoxy group, ethoxy group, propoxy group, and butoxy group), an alkyloxycarbonyl group, and the like.

In the polymer (I), the repeating unit (1) may be a repeating unit shown by the following general formula (1-1) (hereinafter may be referred to as "repeating unit (1-1)").

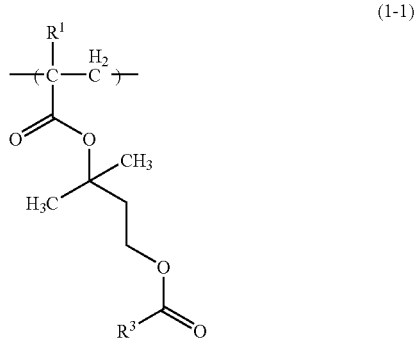

(1-1)

wherein $R^1$ represents a hydrogen atom or a methyl group, and $R^3$ represents a substituted or unsubstituted linear or branched monovalent alkyl group having 1 to 20 carbon atoms, an alicyclic group having 3 to 25 carbon atoms, or an aryl group having 6 to 22 carbon atoms.

Specific examples of the alkyl group represented by $R^3$ in the general formula (1-1) include a methyl group, an ethyl group, a propyl group, a butyl group, a hexyl group, an octyl group, and the like. The alkyl group may be linear or branched. The alkyl group may be substituted. Specific examples of the substituent include a hydroxyl group, a carboxyl group, a halogen atom (e.g., fluorine atom, chlorine atom, and bromine atom), an alkoxy group (e.g., methoxy group, ethoxy group, propoxy group, and butoxy group), an alkyloxycarbonyl group, and the like.

The description that has been given in connection with the alicyclic group represented by $R^2$ in the general formula (1) may be applied to the alicyclic group having 3 to 25 carbon atoms represented by $R^3$.

The description that has been given in connection with the aryl group represented by $R^2$ in the general formula (1) may be applied to the aryl group having 6 to 22 carbon atoms represented by $R^3$.

The repeating unit (1) may be obtained using a compound shown by the following general formula (M-1) as a monomer, for example.

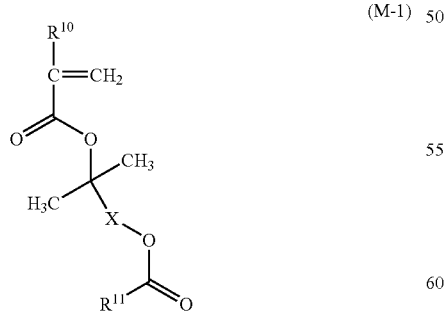

(M-1)

wherein $R^{10}$ represents a hydrogen atom or a methyl group, $R^{11}$ represents a substituted or unsubstituted linear or branched monovalent alkyl group having 1 to 20 carbon atoms, an alicyclic group having 3 to 25 carbon atoms, or an aryl group having 6 to 22 carbon atoms, and X represents a substituted or unsubstituted methylene group or a substituted or unsubstituted linear, branched or alicyclic hydrocarbon group having 2 to 25 carbon atoms.

The description that has been given in connection with $R^2$ and X in the general formula (1) may be applied to $R^{11}$ and X in the general formula (M-1).

The monomer shown by the general formula (M-1) may be produced by reacting 3-methyl-1,3-butanediol with 1-adamantane carbonyl chloride to synthesize a tertiary alcohol compound that includes an adamantane residue, and reacting the tertiary alcohol compound with methacrylic chloride.

The polymer (I) may include only the repeating unit (1), or may further include at least one of a repeating unit shown by the following general formula (2) (hereinafter may be referred to as "repeating unit (2)"), a repeating unit shown by the following general formula (3) (hereinafter may be referred to as "repeating unit (3)"), and a repeating unit shown by the following general formula (4) (hereinafter may be referred to as "repeating unit (4)") in addition to the repeating unit (1).

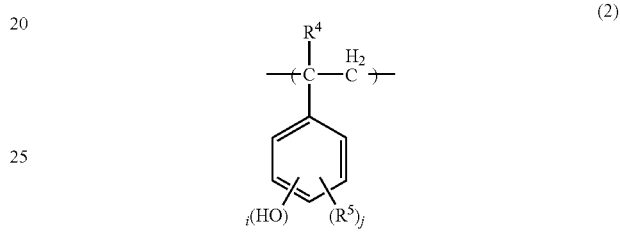

(2)

wherein $R^4$ represents a hydrogen atom or a methyl group, $R^5$ represents a hydrogen atom or a monovalent organic group, i is an integer from 1 to 3, and j is an integer from 0 to 3,

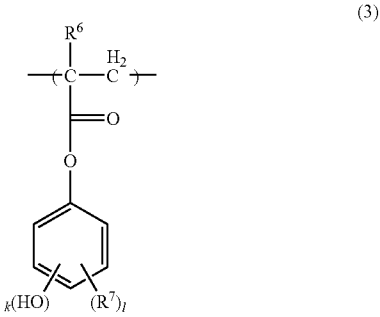

(3)

wherein $R^6$ represents a hydrogen atom or a methyl group, $R^7$ represents a hydrogen atom or a monovalent organic group, k is an integer from 1 to 3, and l is an integer from 0 to 3,

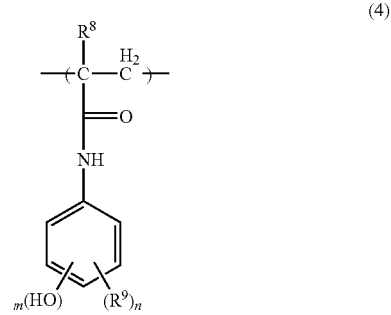

(4)

wherein $R^8$ represents a hydrogen atom or a methyl group, $R^9$ represents a hydrogen atom or a monovalent organic group, m is an integer from 1 to 3, and n is an integer from 0 to 3.

Examples of the monovalent organic group represented by $R^5$ in the general formula (2) include linear or branched alkyl groups having 1 to 12 carbon atoms (e.g., methyl group, ethyl group, n-propyl group, i-propyl group, n-butyl group, 2-methylpropyl group, 1-methylpropyl group, and t-butyl group); linear or branched alkoxy groups having 1 to 12 carbon atoms (e.g., methoxy group, ethoxy group, n-propoxy group, i-propoxy group, n-butoxy group, 2-methylpropoxy group, 1-methylpropoxy group, and t-butoxy group); and the like. Among these, a methyl group, an ethyl group, an n-butyl group, and a t-butyl group are preferable.

i in the general formula (2) is an integer from 1 to 3, and preferably 1 or 2.

j in the general formula (2) is an integer from 0 to 3, and preferably 0 to 2.

Specific examples of the repeating unit (2) shown by the general formula (2) include repeating units shown by the following formulas (2-1) to (2-4), and the like.

Note that the polymer (I) may include only one type of repeating unit (2), or may include two or more types of repeating units (2).

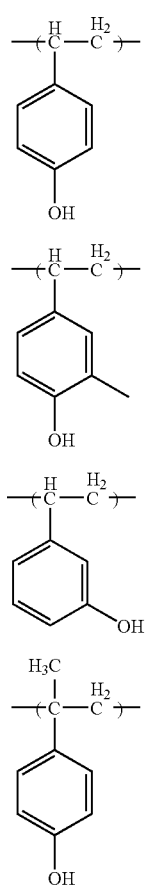

The description that has been given in connection with the monovalent organic group represented by $R^5$ may be applied to the monovalent organic group represented by $R^7$ in the general formula (3).

k in the general formula (3) is an integer from 1 to 3, and preferably 1 or 2.

l in the general formula (3) is an integer from 0 to 3, and preferably 0 or 1.

Specific examples of the repeating unit (3) shown by the general formula (3) include repeating units shown by the following formulas (3-1) and (3-2), and the like.

Note that the polymer (I) may include only one type of repeating unit (3), or may include two or more types of repeating units (3).

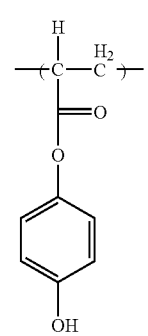

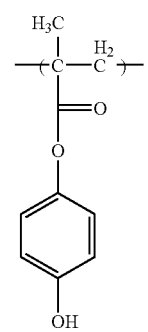

The description that has been given in connection with the monovalent organic group represented by $R^5$ may be applied to the monovalent organic group represented by $R^9$ in the general formula (4).

m in the general formula (4) is an integer from 1 to 3, and preferably 1 or 2.

n in the general formula (4) is an integer from 0 to 3, and preferably 0 or 1.

Specific examples of the repeating unit (4) shown by the general formula (4) include repeating units shown by the following formulas (4-1) and (4-2), and the like.

Note that the polymer (I) may include only one type of repeating unit (4), or may include two or more types of repeating units (4).

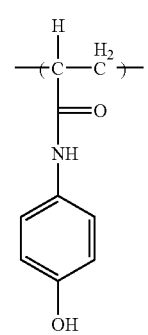

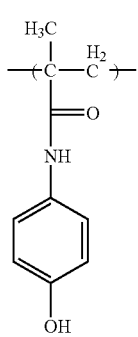
(4-2)

The repeating units shown by the formulas (2-1) to (2-3) may be obtained using the corresponding hydroxystyrene derivative as a monomer. The repeating units shown by the formulas (2-1) to (2-3) may also be obtained using a compound that produces the corresponding hydroxystyrene derivative via hydrolysis as a monomer.

p-Acetoxystyrene, p-(1-ethoxyethoxy)styrene, and the like are preferable as the monomers used to produce the repeating units shown by the formulas (2-1) to (2-3). When using these monomers, the repeating units shown by the formulas (2-1) to (2-3) may be produced by polymerizing the monomers, and hydrolyzing the side chain of the resulting polymer.

The repeating units shown by the formulas (2-4), (3-1), (3-2), (4-1), and (4-2) may be obtained using the corresponding monomers.

The monomers used to produce the repeating units shown by the formulas (2-4), (3-1), (3-2), (4-1), and (4-2) are preferably p-isopropenylphenol, 4-hydroxyphenyl acrylate, 4-hydroxyphenyl methacrylate, N-(4-hydroxyphenyl)acrylamide, N-(4-hydroxyphenyl)methacrylamide, or the like.

The polymer (I) may further include a repeating unit derived from a non-acid-dissociable compound (hereinafter may be referred to as "repeating unit (5)") and a repeating unit derived from an acid-dissociable compound (hereinafter may be referred to as "repeating unit (6)") other than the repeating units (1) to (4).

Examples of the non-acid-dissociable compound include styrene, α-methylstyrene, 4-methylstyrene, 2-methylstyrene, 3-methylstyrene, isobornyl acrylate, tricyclodecanyl(meth)acrylate, tetracyclododecenyl(meth)acrylate, a compound shown by the following formula (b-1), and the like. Among these, styrene, α-methylstyrene, 4-methylstyrene, 2-methylstyrene, 3-methylstyrene, tricyclodecanyl acrylate, and the compound shown by the formula (b-1) are preferable.

Note that the polymer (I) may include only one type of repeating unit (5), or may include two or more types of repeating units (5).

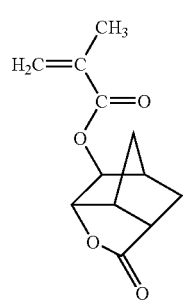
(b-1)

Examples of the acid-dissociable compound include compounds shown by the following general formulas (c-1) and (c-2), and the like.

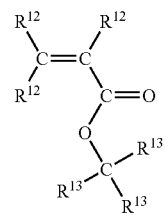
(c-1)

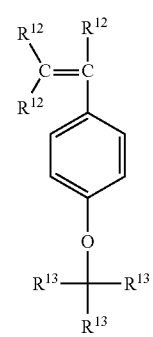
(c-2)

wherein each of $R^{12}$ represents one of a hydrogen atom, a methyl group, a trifluoromethyl group, and a hydroxymethyl group, and each of $R^{13}$ represents one of a monovalent alicyclic hydrocarbon group having 4 to 20 carbon atoms, a derivative thereof, and a linear or branched alkyl group having 1 to 4 carbon atoms.

Examples of the monovalent alicyclic hydrocarbon group having 4 to 20 carbon atoms represented by $R^{13}$ in the general formulas (c-1) and (c-2) include a group that includes an alicyclic ring derived from a cycloalkane (e.g., norbornane, tricyclodecane, tetracyclododecane, adamantane, cyclobutane, cyclopentane, cyclohexane, cycloheptane, or cyclooctane); a group obtained by substituting the above group with at least one linear or branched alkyl group having 1 to 4 carbon atoms (e.g., methyl group, ethyl group, n-propyl group, i-propyl group, n-butyl group, 2-methylpropyl group, 1-methylpropyl group, or t-butyl group); and the like. Two of $R^{13}$ may bond to form a divalent alicyclic hydrocarbon group or a derivative thereof together with the carbon atom that is bonded to the two $R^{13}$.

Among these alicyclic hydrocarbon groups, an alicyclic group derived from norbornane, tricyclodecane, tetracyclododecane, adamantane, cyclopentane, or cyclohexane, a group obtained by substituting the above alicyclic group with the above alkyl group, and the like are preferable.

Examples of the linear or branched alkyl group having 1 to 4 carbon atoms represented by $R^{13}$ include a methyl group, an ethyl group, an n-propyl group, an i-propyl group, an n-butyl group, a 2-methylpropyl group, a 1-methylpropyl group, a t-butyl group, and the like.

Specific preferable examples of the repeating unit (6) include repeating units shown by the following general formulas (6-1) to (6-8), and the like.

(6-1) 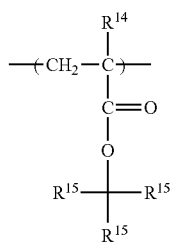

(6-2) 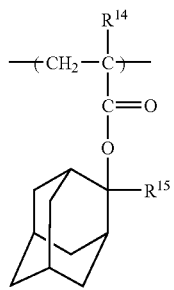

(6-3) 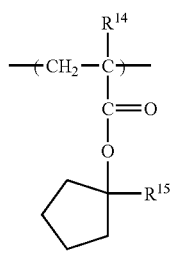

(6-4) 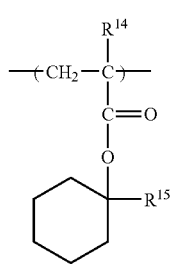

(6-5) 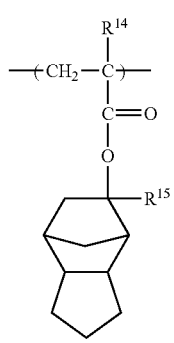

(6-6) 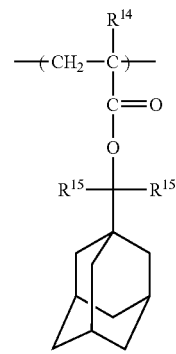

(6-7) 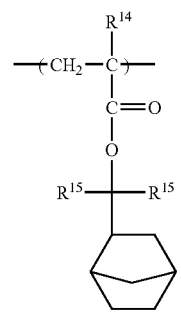

(6-8) 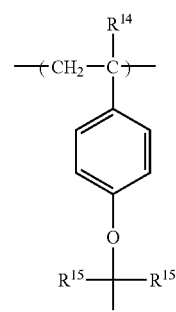

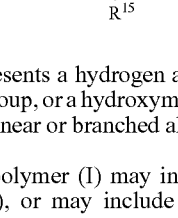

wherein $R^{14}$ represents a hydrogen atom, a methyl group, a trifluoromethyl group, or a hydroxymethyl group, and each of $R^{15}$ represents a linear or branched alkyl group having 1 to 4 carbon atoms.

Note that the polymer (I) may include only one type of repeating unit (6), or may include two or more types of repeating units (6).

The content of the repeating unit (1) in the polymer (I) is preferably 1 mol % or more, more preferably 5 to 90 mol %, and still more preferably 5 to 50 mol %, based on the total amount (100 mol %) of the repeating units included in the polymer (I). If the content of the repeating unit (1) is 1 mol % or more, a radiation-sensitive composition that includes the polymer (I) as an acid-dissociable group-containing polymer exhibits a small degree of nano edge roughness.

The total content of the repeating units (2) to (4) in the polymer (I) is preferably 1 mol % or more, more preferably 10 to 95 mol %, and still more preferably 50 to 95 mol %, based on the total amount (100 mol %) of the repeating units included in the polymer (I). If the total content of the repeating units (2) to (4) exceeds 95 mol %, a radiation-sensitive composition that includes the polymer (I) as an acid-dissociable group-containing polymer may exhibit a large degree of nano edge roughness.

The total content of the repeating units (1) to (4) is preferably 10 mol % or more, more preferably 40 to 100 mol %, and still more preferably 50 to 100 mol %, based on the total amount (100 mol %) of the repeating units included in the polymer (I). If the total content of the repeating units (1) to (4) is 10 mol % or more, a radiation-sensitive composition that includes the polymer (I) as an acid-dissociable group-containing polymer exhibits a small degree of nano edge roughness.

The content of the repeating unit (5) in the polymer (I) is normally 60 mol % or less, and preferably 0 to 50 mol %, based on the total amount (100 mol %) of the repeating units included in the polymer (I). If the content of the repeating unit (5) is 60 mol % or less, a radiation-sensitive composition that includes the polymer (I) as an acid-dissociable group-containing polymer exhibits resolution and nano edge roughness in a well-balanced manner.

The content of the repeating unit (6) in the polymer (I) is normally 60 mol % or less, and preferably 0 to 50 mol %, based on the total amount (100 mol %) of the repeating units included in the polymer (I). If the content of the repeating unit (6) is 60 mol % or less, a radiation-sensitive composition that includes the polymer (I) as an acid-dissociable group-containing polymer exhibits resolution and nano edge roughness in a well-balanced manner.

The total content of the repeating units (5) and (6) in the polymer (I) is 90 mol % or less, preferably 0 to 80 mol %, and more preferably 0 to 70 mol %, based on the total amount (100 mol %) of the repeating units included in the polymer (I). If the total content of the repeating units (5) and (6) is 90 mol % or less, a radiation-sensitive composition that includes the polymer (I) as an acid-dissociable group-containing polymer exhibits resolution and nano edge roughness in a well-balanced manner.

The polymer (I) may be synthesized by an arbitrary method. For example, the polymer (I) may be synthesized by radical polymerization or anionic polymerization. The hydroxystyrene unit (side chain) of the repeating units (2) to (4) may be obtained by hydrolyzing the polymer (I) (e.g., acetoxy group) in an organic solvent in the presence of a base or an acid.

For example, radical polymerization may be implemented by stiffing and heating the monomers such as the compound (M-1) in an appropriate organic solvent under a nitrogen atmosphere in the presence of a radical polymerization initiator.

Examples of the radical polymerization initiator include azo compounds such as 2,2'-azobisisobutylonitrile, 2,2'-azobis(2,4-dimethylvaleronitrile), 2,2'-azobis(4-methoxy-2,4-dimethylvaleronitrile), 2,2'-azobismethylbutyronitrile, 2,2'-azobiscyclohexanecarbonitrile, cyanomethylethylazoformamide, 2,2'-azobis(methyl 2,4-dimethylpropanate), and 2,2'-azobiscyanovaleric acid; organic peroxides such as benzoyl peroxide, lauroyl peroxide, 1,1'-bis(t-butylperoxy)cyclohexane, 3,5,5-trimethylhexanoyl peroxide, and t-butyl peroxy-2-ethylhexanoate; hydrogen peroxide; and the like.

A polymerization promoter such as 2,2,6,6-tetramethyl-1-piperidinyloxy, iodine, a mercaptan, or a styrene dimer may optionally be used for radical polymerization.

The radical polymerization temperature is appropriately selected (e.g., 50 to 200° C.) depending on the type of initiator, and the like. When using an azo initiator or a peroxide initiator, the radical polymerization temperature is preferably determined so that the half-life of the initiator is about 10 minutes to about 30 hours, and more preferably about 30 minutes to about 10 hours.

The anionic polymerization time is determined depending on the type of initiator and the reaction temperature, but is preferably determined so that 50% or more of the initiator is consumed (generally about 0.5 to about 24 hours).

Anionic polymerization may be implemented by stiffing the monomers such as the compound (M-1) at a given temperature in an appropriate organic solvent under a nitrogen atmosphere in the presence of an anionic polymerization initiator, for example.

Examples of the anionic polymerization initiator include organic alkali metals such as n-butyllithium, s-butyllithium, t-butyllithium, ethyllithium, ethyl sodium, 1,1-diphenylhexyllithium, 1,1-diphenyl-3-methylpentyllithium, and the like.

The anionic polymerization temperature is appropriately selected depending on the type of initiator, and the like. When using an alkyllithium, the anionic polymerization temperature is preferably −100 to 50° C., and more preferably −78 to 30° C.

The anionic polymerization time is determined depending on the type of initiator and the reaction temperature, but is preferably determined so that 50% or more of the initiator is consumed (generally about 0.5 to about 24 hours).

Note that the polymer (1) may be synthesized by heating the monomers without using the polymerization initiator, or may be synthesized by cationic polymerization.

Examples of an acid used when introducing the hydroxystyrene unit by hydrolyzing the side chain of the polymer (I) include organic acids such as p-toluenesulfonic acid, a hydrate thereof, methanesulfonic acid, trifluoromethanesulfonic acid, malonic acid, oxalic acid, and 1,1,1-fluoroacetic acid; inorganic acids such as sulfuric acid, hydrochloric acid, phosphoric acid, and hydrobromic acid; salts such as pyridinium p-toluenesulfonate, ammonium p-toluenesulfonate, and 4-methylpyridinium p-toluenesulfonate; and the like.

Examples of a base include inorganic bases such as potassium hydroxide, sodium hydroxide, sodium carbonate, and potassium carbonate; organic bases such as triethylamine, N-methyl-2-pyrrolidone, piperidine, and tetramethylammonium hydroxide; and the like.

Examples of the organic solvent used for polymerization or hydrolysis include ketones such as acetone, methyl ethyl ketone, and methyl amyl ketone; ethers such as diethyl ether and tetrahydrofuran (THF); alcohols such as methanol, ethanol, and propanol; aliphatic hydrocarbons such as hexane, heptane, and octane; aromatic hydrocarbons such as benzene, toluene, and xylene; alkyl halides such as chloroform, bromoform, methylene chloride, methylene bromide, and carbon tetrachloride; esters such as ethyl acetate, butyl acetate, ethyl lactate, propylene glycol monomethyl ether, propylene glycol monomethyl ether acetate, and cellosolve; aprotic polar solvent such as dimethylformamide, dimethyl sulfoxide, and hexamethylphosphoroamide; and the like.

Among these, acetone, methyl amyl ketone, methyl ethyl ketone, tetrahydrofuran, methanol, ethanol, propanol, ethyl acetate, butyl acetate, ethyl lactate, propylene glycol monomethyl ether, propylene glycol monomethyl ether acetate, and the like are preferable.

The polystyrene-reduced weight average molecular weight (Mw) of the polymer (I) determined by gel permeation chromatography (GPC) is 3000 to 100,000, preferably 3000 to 40,000, and more preferably 3000 to 25,000.

The ratio (Mw/Mn) of the Mw to the polystyrene-reduced number average molecular weight (Mn) of the polymer (I) determined by GPC is normally 1 to 5, preferably 1 to 3, and more preferably 1 to 2.5.

[2] Radiation-Sensitive Composition

A radiation-sensitive composition according to one embodiment of the invention includes (A) an acid-dissociable group-containing polymer that is insoluble or scarcely soluble in alkali and converted into alkali-soluble by an action of an acid, and (B) a photoacid generator.

[2-1] Acid-Dissociable Group-Containing Polymer

The acid-dissociable group-containing polymer (hereinafter may be referred to as "polymer (A)") is insoluble or scarcely soluble in alkali and converted into alkali-soluble by an action of an acid. The expression "insoluble or scarcely soluble in alkali" means that a film (thickness: 100 nm) that is formed only of the polymer (A) has a thickness equal to or more than 50% of the initial thickness when developed under alkaline development conditions employed when forming a resist pattern using a resist film that is formed of a radiation-sensitive composition that includes the polymer (A).

The description that has been given in connection with the polymer (I) may be applied to the polymer (A).

The radiation-sensitive composition according to one embodiment of the invention exhibits excellent sensitivity due to the acid-dissociable group-containing compound (polymer (A)). The radiation-sensitive composition can thus form a resist film that effectively responds to electron beams or extreme ultraviolet rays during a lithography process, shows only a small degree of roughness, exhibits excellent etching resistance and high sensitivity, and accurately and stably forms a fine pattern.

[2-2] Photoacid Generator

The acid generator (B) generates an acid when applying electron beams, radiation, or the like to the radiation-sensitive composition during a lithography process. The acid-dissociable group of the polymer dissociates due to the acid generated by the acid generator (B).

For example, the acid generator (B) is preferably at least one compound selected from the group consisting of onium salts, diazomethane compounds, and sulfonimide compounds in order to achieve excellent acid generation efficiency, heat resistance, and the like. These compounds may be used either individually or in combination.

Examples of the onium salt compounds include iodonium salts, sulfonium salts, phosphonium salts, diazonium salts, pyridinium salts, and the like. Specific examples of the onium salts include triphenylsulfonium trifluoromethanesulfonate, triphenylsulfonium nonafluoro-n-butanesulfonate, triphenylsulfonium benzenesulfonate, triphenylsulfonium 10-camphorsulfonate, triphenylsulfonium n-octanesulfonate, triphenylsulfonium 4-trifluoromethylbenzensulfonate, triphenylsulfonium naphthalenesulfonate, triphenylsulfonium perfluorobenzenesulfonate, triphenylsulfonium 1,1,2,2-tetrafluoro-2-(tetracyclo[4.4.0.1$^{2,5}$.1$^{7,10}$]dodecan-8-yl)ethanesulfonate, triphenylsulfonium 1,1-difluoro-2-(bicyclo[2.2.1]heptane-2-yl)ethanesulfonate; (4-t-butoxyphenyl)diphenylsulfonium trifluoromethanesulfonate, (4-t-butoxyphenyl)diphenylsulfonium nonafluoro-n-butanesulfonate, (4-t-butoxyphenyl)diphenylsulfonium perfluoro-n-octanesulfonate, (4-t-butoxyphenyl)diphenylsulfonium 10-camphorsulfonate, (4-hydroxyphenyl)diphenylsulfonium trifluoromethanesulfonate, (4-hydroxyphenyl)diphenylsulfonium nonafluoro-n-butanesulfonate, (4-hydroxyphenyl)diphenylsulfonium perfluoro-n-octanesulfonate, (4-hydroxyphenyl)diphenylsulfonium 10-camphorsulfonate, (4-hydroxyphenyl)diphenylsulfonium n-octanesulfonate, tris(4-methoxyphenyl)sulfonium trifluoromethanesulfonate, tris(4-methoxyphenyl)sulfonium nonafluoro-n-butanesulfonate, tris(4-methoxyphenyl)sulfonium perfluoro-n-octanesulfonate, tris(4-methoxyphenyl)sulfonium 10-camphorsulfonate, (4-fluorophenyl)diphenylsulfonium trifluoromethanesulfonate, (4-fluorophenyl)diphenylsulfonium nonafluoro-n-butanesulfonate, (4-fluorophenyl)diphenylsulfonium 10-camphorsulfonate; tris(4-fluorophenyl)sulfonium trifluoromethanesulfonate, tris(4-fluorophenyl)sulfonium nonafluoro-n-butanesulfonate, tris(4-fluorophenyl)sulfonium 10-camphorsulfonate, tris(4-fluorophenyl)sulfonium p-toluenesulfonate, tris(4-trifluoromethylphenyl)sulfonium trifluoromethanesulfonate, 2,4,6-trimethylphenyldiphenylsulfonium trifluoromethanesulfonate, 2,4,6-trimethylphenyldiphenylsulfonium 2,4-difluorobenzenesulfonate, 2,4,6-trimethylphenyldiphenylsulfonium 4-trifluoromethylbenzensulfonate; diphenyliodonium trifluoromethanesulfonate, diphenyliodonium nonafluoro-n-butanesulfonate, diphenyliodonium perfluoro-n-octanesulfonate, diphenyliodonium 10-camphorsulfonate, diphenyliodonium n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 10-camphorsulfonate, bis(4-t-butylphenyl)iodonium n-octanesulfonate, (4-methoxyphenyl)phenyliodonium trifluoromethanesulfonate, (4-methoxyphenyl)phenyliodonium nonafluoro-n-butanesulfonate, (4-methoxyphenyl)phenyliodonium perfluoro-n-octanesulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate; bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, bis(4-chlorophenyl)iodonium trifluoromethanesulfonate, bis(4-chlorophenyl)iodonium nonafluoro-n-butanesulfonate, bis(4-chlorophenyl)iodonium perfluoro-n-octanesulfonate, bis(4-chlorophenyl)iodonium-n-dodecylbenzenesulfonate, bis(4-chlorophenyl)iodonium 10-camphorsulfonate, bis(4-chlorophenyl)iodonium n-octanesulfonate, bis(4-chlorophenyl)iodonium 4-trifluoromethylbenzensulfonate, bis(4-chlorophenyl)iodonium perfluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium n-dodecylbenzenesulfonate, bis(4-trifluoromethylphenyl)iodonium p-toluenesulfonate, bis(4-trifluoromethylphenyl)iodonium benzenesulfonate, bis(4-trifluoromethylphenyl)iodonium 10-camphorsulfonate, bis(4-trifluoromethylphenyl)iodonium n-octanesulfonate, bis(4-trifluoromethylphenyl)iodonium 4-trifluoromethylbenzensulfonate, bis(4-trifluoromethylphenyl)iodonium perfluorobenzenesulfonate, compounds shown by the following formulas (2x-1) to (2x-27), and the like.

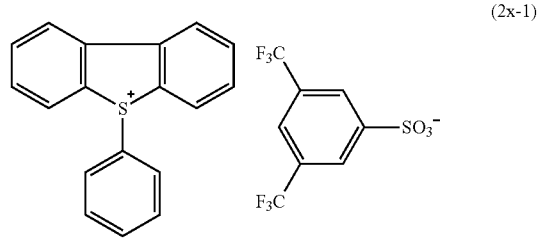

(2x-1)

-continued
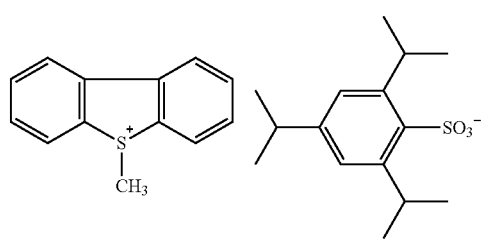 (2x-2)
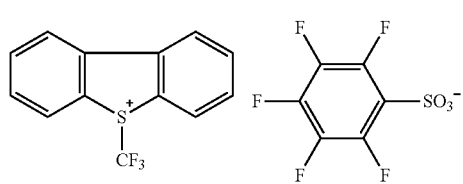 (2x-3)
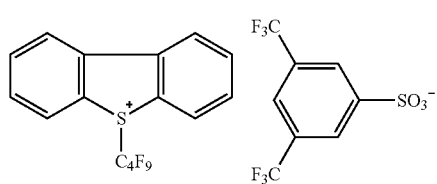 (2x-4)
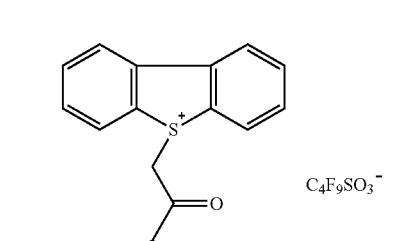 (2x-5)
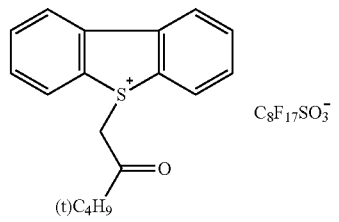 (2x-6)
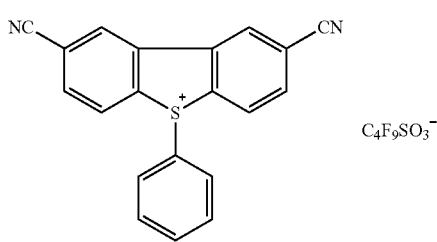 (2x-7)
-continued
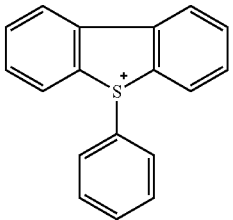 (2x-8)
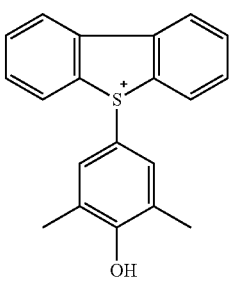 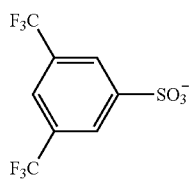 (2x-9)
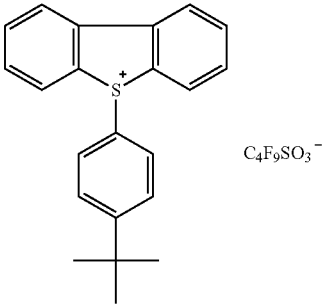 (2x-10)
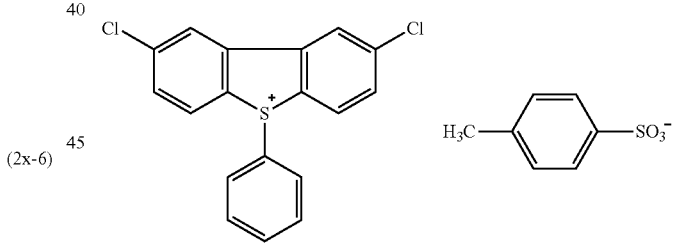 (2x-11)
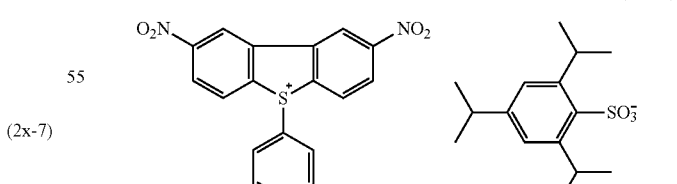 (2x-12)
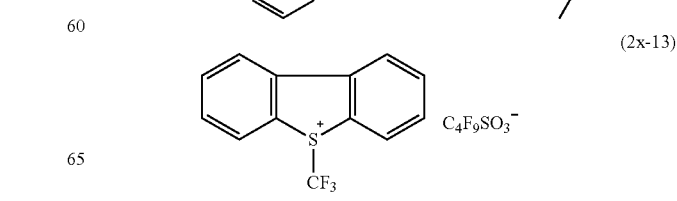 (2x-13)

-continued (2x-14)

(2x-15)

(2x-16)

(2x-17)

(2x-18)

(2x-19)

(2x-20)

(2x-21)

-continued (2x-22)

(2x-23)

(2x-24)

(2x-25)

(2x-26)

(2x-27)

Among these, triphenylsulfonium trifluoromethanesulfonate, triphenylsulfonium nonafluoro-n-butanesulfonate, triphenylsulfonium 10-camphorsulfonate, (4-hydroxyphenyl)diphenylsulfonium trifluoromethanesulfonate, (4-hydroxyphenyl)diphenylsulfonium nonafluoro-n-butanesulfonate, tris(4-methoxyphenyl)sulfonium trifluoromethanesulfonate, tris(4-methoxyphenyl)sulfonium nonafluoro-n-butanesulfonate, (4-fluorophenyl)diphenylsulfonium trifluoromethanesulfonate, (4-fluorophenyl)diphenylsulfonium nonafluoro-n-butanesulfonate, 2,4,6-trimethylphenyldiphenylsulfonium trifluoromethanesulfonate, 2,4,6-trimethylphenyldiphenylsulfonium 2,4-difluorobenzenesulfonate, 2,4,6-trimethylphenyldiphenylsulfonium 4-trifluoromethylbenzensulfonate, diphenyliodonium trifluoromethanesulfonate, diphenyliodonium nonafluoro-n-butanesulfonate, diphenyliodonium 10-camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium 10-camphorsulfonate, (4-fluorophenyl)phenyliodonium trifluoromethanesulfonate, (4-fluorophenyl)phenyliodonium nonafluoro-n-butanesulfonate, (4-fluorophenyl)phenyliodonium 10-camphorsulfonate, bis(4-fluorophenyl)iodonium trifluoromethanesulfonate, bis(4-fluorophenyl)iodonium nonafluoro-n-butanesulfonate, bis(4-fluorophenyl)iodonium 10-camphorsulfonate, tris(4-trifluoromethylphenyl)sulfonium trifluoromethanesulfonate, triphenylsulfonium 1,1,2,2-tetrafluoro-2-(tetracyclo[4.4.0.1$^{2,5}$.1$^{7,10}$]dodecan-8-yl) ethanesulfonate, triphenylsulfonium 1,1-difluoro-2-(bicyclo [2.2.1]heptan-2-yl)ethanesulfonate, and the compounds shown by the formulas (2x-13), (2x-16), (2x-17), (2x-18), (2x-19), (2x-20), and (2x-27) are preferable.

Specific examples of the diazomethane compounds include bis(trifluoromethanesulfonyl)diazomethane, bis(cyclohexylsulfonyl)diazomethane, bis(3,3-dimethyl-1,5-dioxaspiro[5.5]dodecane-8-sulfonyl)diazomethane, bis(1,4-dioxaspiro[4.5]decane-7-sulfonyl)diazomethane, bis(t-butylsulfonyl)diazomethane, and the like.

Among these, bis(cyclohexylsulfonyl)diazomethane, bis(3,3-dimethyl-1,5-dioxaspiro[5.5]dodecane-8-sulfonyl)diazomethane, and bis(1,4-dioxaspiro[4.5]decane-7-sulfonyl) diazomethane are preferable.

Specific examples of the sulfonimide compounds include
N-(trifluoromethylsulfonyloxy)bicyclo[2.2.1]hept-5-ene-2,3-dicarboxylmide,
N-(trifluoromethylsulfonyloxy)-7-oxabicyclo[2.2.1]hept-5-ene-2,3-dicarboxylmide,
N-(trifluoromethylsulfonyloxy)bicyclo[2.2.1]heptan-5,6-oxy-2,3-dicarboxylmide;
N-(10-camphorsulfonyloxy)succinimide, N-(10-camphorsulfonyloxy)phthalimide,
N-(10-camphorsulfonyloxy)-7-oxabicyclo[2.2.1]hept-5-ene-2,3-dicarboxylmide,
N-(10-camphorsulfonyloxy)bicyclo[2.2.1]heptan-5,6-oxy-2,3-dicarboxylmide,
N-(10-camphorsulfonyloxy)naphthylimide,
N-[(5-methyl-5-carboxymethylbicyclo[2.2.1]heptan-2-yl) sulfonyloxy]succinimide,
N-(n-octylsulfonyloxy)bicyclo[2.2.1]hept-5-ene-2,3-dicarboxylmide,
N-(n-octylsulfonyloxy)bicyclo[2.2.1]heptane-5,6-oxy-2,3-dicarboxylmide,
N-(perfluorophenylsulfonyloxy)bicyclo[2.2.1]hept-5-ene-2,3-dicarboxylmide,
N-(perfluorophenylsulfonyloxy)-7-oxabicyclo[2.2.1]hept-5-ene-2,3-dicarboxylmide,
N-(perfluorophenylsulfonyloxy)bicyclo[2.2.1]heptan-5,6-oxy-2,3-dicarboxylmide,
N-(nonafluoro-n-butylsulfonyloxy)bicyclo[2.2.1]hept-5-ene-2,3-dicarboxylmide,
N-(nonafluoro-n-butylsulfonyloxy)-7-oxabicyclo[2.2.1] hept-5-ene-2,3-dicarboxylmide,
N-(nonafluoro-n-butylsulfonyloxy)bicyclo[2.2.1]heptan-5,6-oxy-2,3-dicarboxylmide,
N-(perfluoro-n-octylsulfonyloxy)bicyclo[2.2.1]hept-5-ene-2,3-dicarboxylmide,
N-(perfluoro-n-octylsulfonyloxy)-7-oxabicyclo[2.2.1]hept-5-ene-2,3-dicarboxylmide,
N-(perfluoro-n-octylsulfonyloxy)bicyclo[2.2.1]heptan-5,6-oxy-2,3-dicarboxylmide, and the like.

Among these,
N-(trifluoromethylsulfonyloxy)bicyclo[2.2.1]hept-5-ene-2,3-dicarboxylmide,
N-(10-camphorsulfonyloxy)succinimide, and
N-[(5-methyl-5-carboxymethylbicyclo[2.2.1]heptan-2-yl) sulfonyloxy]succinimide are preferable.

The acid generator (B) is preferably used in an amount of 0.1 to 50 parts by mass, and more preferably 0.5 to 50 parts by mass, based on 100 parts by mass of the polymer (A). If the amount of the acid generator (B) is less than 0.1 parts by mass, the sensitivity and the developability of the radiation-sensitive composition may decrease. If the amount of the acid generator (B) exceeds 50 parts by mass, the transparency to radiation, the pattern shape, the heat resistance, and the like of the radiation-sensitive composition may deteriorate.

[2-3] Acid Diffusion Controller

The radiation-sensitive composition according to one embodiment of the invention preferably further includes an acid diffusion controller (hereinafter may be referred to as "acid diffusion controller (C)") in addition to the polymer (A) and the acid generator (B).

The acid diffusion controller (C) controls a phenomenon wherein an acid generated by the acid generator (B) upon exposure is diffused in the resist film, and suppresses undesired chemical reactions in the unexposed area. The acid diffusion controller (C) improves the storage stability of the resulting radiation-sensitive composition and the resolution of a resist film that is formed using the radiation-sensitive composition. Moreover, the acid diffusion controller (C) prevents a change in line width of the resist pattern due to a change in post-exposure delay (PED) from exposure to post-exposure bake, so that a radiation-sensitive composition that exhibits excellent process stability can be obtained.

A nitrogen-containing organic compound or a photosensitive basic compound is preferably used as the acid diffusion controller (C).

Examples of the nitrogen-containing organic compound include a compound shown by the following general formula (7) (hereinafter may be referred to as "nitrogen-containing compound (i)"), a compound that includes two nitrogen atoms in the molecule (hereinafter may be referred to as "nitrogen-containing compound (ii)"), a polyamino compound or a polymer that includes three or more nitrogen atoms (hereinafter may be collectively referred to as "nitrogen-containing compound (iii)"), an amide group-containing compound, a urea compound, a nitrogen-containing heterocyclic compound, and the like.

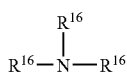
(7)

wherein each of $R^{16}$ represents one of a hydrogen atom, a substituted or unsubstituted linear, branched or cyclic alkyl group, a substituted or unsubstituted aryl group, and a substituted or unsubstituted aralkyl group.

Preferable examples of the nitrogen-containing compound (i) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo) alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and substituted alkylamines such as triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline; and the like.

Preferable examples of the nitrogen-containing compound (ii) include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis (2-diethylaminoethyl)ether, 1-(2-hydroxyethyl)-2-imidazolizinone, 2-quinoxalinol, N,N,N',N'-tetrakis(2-hydroxypropyl)ethylenediamine, N,N,N',N'',N'''-pentamethyldiethylenetriamine, and the like.

Preferable examples of the nitrogen-containing compound (iii) include polyethyleneimine, polyallylamine, poly(2-dimethylaminoethylacrylamide), and the like.

Preferable examples of the amide group-containing compounds include N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanuric acid; and the like.

Preferable examples of the urea compound include urea, methylurea, 1,1-dimethylurea, 1,3-dimethylurea, 1,1,3,3-tetramethylurea, 1,3-diphenylurea, tri-n-butylthiourea, and the like.

Preferable examples of the nitrogen-containing heterocyclic compounds include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2''-terpyridine; piperazines such as piperazine and 1-(2-hydroxyethyl)piperazine; and pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

The photosensitive basic compound is decomposed and loses basicity in the exposed area, and remains undecomposed in the unexposed area. The photosensitive basic compound can effectively utilize an acid generated in the exposed area, and can thus improve sensitivity as compared with a non-photosensitive basic compound.

The type of photosensitive basic compound is not particularly limited insofar the photosensitive basic compound has the above properties. Specific examples of the photosensitive basic compound include compounds shown by the following general formulas (8-1) and (8-2), and the like.

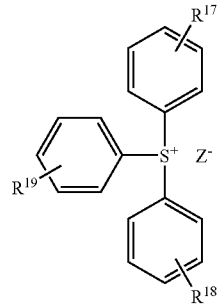
(8-1)

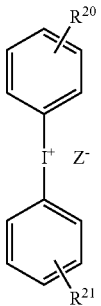
(8-2)

wherein each of $R^{17}$, $R^{18}$, $R^{19}$, $R^{20}$, and $R^{21}$ represents one of a hydrogen atom, a halogen atom, a substituted or unsubstituted alkyl group having 1 to 10 carbon atoms, and a substituted or unsubstituted alicyclic hydrocarbon group, and $Z^-$ represents $OH^-$, $R^{22}OH^-$, or $R^{22}COO^-$ (wherein $R^{22}$ represents a monovalent organic group).

Examples of the substituted or unsubstituted alkyl group having 1 to 10 carbon atoms represented by $R^{17}$ to $R^{21}$ in the general formulas (8-1) and (8-2) include a methyl group, an ethyl group, an n-butyl group, a t-butyl group, a trifluoromethyl group, and the like. Note that the alkyl group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the substituted or unsubstituted alicyclic hydrocarbon group represented by $R^{17}$ to $R^{21}$ include the structures shown by the general formulas (a-1) to (a-50), and the like. Note that the alicyclic hydrocarbon group may be substituted with a hydroxyl group, a carboxyl group, a halogen atom (e.g., fluorine atom or bromine atom), an alkoxy group (e.g., methoxy group, ethoxy group, propoxy group, butoxy group, or t-butoxy group), an alkyloxycarbonyl group (e.g., t-butoxycarbonylmethyloxy group), or the like.

Examples of the halogen atom represented by $R^{17}$ to $R^{21}$ include a fluorine atom, a chlorine atom, a bromine atom, and an iodine atom.

$R^{17}$ to $R^{21}$ preferably represent a hydrogen atom or a t-butyl group. $R^{17}$ to $R^{19}$ in the general formula (8-1) may be either the same or different. $R^{20}$ and $R^{21}$ in the general formula (8-2) may be either the same or different.

$Z^-$ in the general formulas (8-1) and (8-2) represents $OH^-$, $R^{22}O^-$, or $R^{22}COO^-$.

Examples of the monovalent organic group represented by $R^{22}$ include a substituted or unsubstituted alkyl group, a substituted or unsubstituted aryl group, and the like.

$Z^-$ preferably represents $OH^-$, $CH_3COO^-$, or any of compounds (Z-1) to (Z-5) shown by the following formulas.

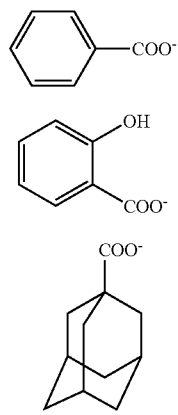

Specific examples of the photosensitive basic compound include a triphenylsulfonium compound (i.e., the compound shown by the general formula (8-1)) wherein the anion moiety ($Z^-$) is $OH^-$, $CH_3COO^-$, or the compound (Z-2) or (Z-3), and the like.

The acid diffusion controllers (C) may be used either individually or in combination.

The acid diffusion controller (C) is preferably used in an amount of 15 parts by mass or less, more preferably 0.001 to 10 parts by mass, and still more preferably 0.005 to 5 parts by mass, based on 100 parts by mass of the polymer (A). If the amount of the acid diffusion controller (C) exceeds 15 parts by mass, the sensitivity of the resulting resist film or the developability of the exposed area may decrease. If the amount of the acid diffusion controller (C) is less than 0.001 parts by mass, the pattern shape or the dimensional accuracy of the resulting resist film may deteriorate depending on the process conditions.

[2-4] Other Components

The radiation-sensitive composition according to one embodiment of the invention is preferably prepared by dissolving the polymer (A), the acid generator (B), and the acid diffusion controller (C) in a solvent. Specifically, the radiation-sensitive composition preferably further includes a solvent.

Additives such as a surfactant, a sensitizer, and an aliphatic additive may optionally be added to the radiation-sensitive composition.

The solvent is preferably at least one compound selected from the group consisting of linear or branched ketones, cyclic ketones, propylene glycol monoalkyl ether acetates, alkyl 2-hydroxypropionates, alkyl 3-alkoxypropionates, and γ-butyrolactone.

The solvent is preferably used so that the total solid content of the radiation-sensitive composition is 1 to 70 mass %, more preferably 1 to 15 mass %, and still more preferably 1 to 10 mass %.

The radiation-sensitive composition may be prepared by homogeneously dissolving the polymer (A), the acid generator (B), the acid diffusion controller (C), and other optional components (excluding the solvent) in the solvent so that the total solid content is within the above range. The radiation-sensitive composition thus prepared is preferably filtered through a filter having a pore size of about 0.2 μm, for example.

The surfactant improves the applicability, striation, developability, and the like of the radiation-sensitive composition.

Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate, commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), MEGAFAC F171, MEGAFAC F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.), and the like. These surfactants may be used either individually or in combination.

The surfactant is preferably used in an amount of 0.001 to 2 parts by mass based on 100 parts by mass of the polymer (A).

The sensitizer absorbs the energy of radiation, and transmits the energy to the acid generator (B) so that the amount of acid generated increases. Specifically, the sensitizer improves the apparent sensitivity of the radiation-sensitive composition.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

The sensitizer is preferably used in an amount of 0.1 to 10 parts by mass based on 100 parts by mass of the polymer (A).

A dye or a pigment visualizes the latent image in the exposed area, and reduces the effects of halation during exposure. An adhesion improver improves the adhesion of the resist film to a substrate.

The alicyclic additive further improves dry etching resistance, pattern shape, adhesion to a substrate, and the like.

Examples of the alicyclic additive include adamantane derivatives such as 1-adamantanecarboxylic acid, 2-adamantanone, t-butyl-1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo[$4.4.0.1^{2,5}.1^{7,10}$]dodecane; and the like. These alicyclic additives may be used either individually or in combination.

The alicyclic additive is preferably used in an amount of 0.5 to 20 parts by mass based on 100 parts by mass of the polymer (A). If the amount of the alicyclic additive exceeds 20 parts by mass, the heat resistance of the resulting resist film may decrease.

Examples of further additives include an alkali-soluble resin, a low-molecular-weight alkali solubility controller that includes an acid-dissociable protecting group, a halation inhibitor, a preservative, an antifoaming agent, and the like.

[3] Formation of Resist Pattern

The radiation-sensitive composition according to one embodiment of the invention is useful as a material for forming a chemically-amplified positive-tone resist film.

The chemically-amplified positive-tone resist film is designed so that the acid-dissociable group included in the polymer dissociates due to an acid generated by the acid generator upon exposure so that the polymer becomes alkali-soluble. Specifically, an alkali-soluble area occurs in the resist film. The alkali-soluble area corresponds to the exposed area of the resist. The exposed area can be dissolved and removed using an alkaline developer. A positive-tone resist pattern having a desired shape can thus be formed. The resist pattern-forming process is described in detail below.

When forming a resist pattern using the radiation-sensitive composition according to one embodiment of the invention, a resist film is formed using the radiation-sensitive composition. The radiation-sensitive composition may have been filtered through a filter having a pore size of about 0.2 μm after adjusting the total solid content, for example. The radiation-sensitive composition is applied to a substrate (e.g., silicon wafer or aluminum-coated wafer) using an appropriate application method (e.g., rotational coating, cast coating, or roll coating) to form a resist film. The resist film may optionally be pre-baked (PB) at about 70 to 160° C. The resist film is then exposed to form a desired resist pattern.

Examples of radiation that may be used for exposure include (extreme) deep ultraviolet rays such as KrF excimer laser light (wavelength: 248 nm), ArF excimer laser light (wavelength: 193 nm), EUV (extreme ultraviolet rays, wavelength: 13.5 nm), X-rays such as synchrotron radiation, charged particle rays such as electron beams, and the like. The exposure conditions (e.g., dose) may be appropriately determined depending on the composition of the radiation-sensitive composition, the type of additives, and the like. Note that liquid immersion lithography may also be used.

The resist film is preferably subjected to post-exposure bake (PEB) after exposure. PEB ensures smooth dissociation of the acid-dissociable group included in the polymer. The PEB conditions may be appropriately selected depending on the components (composition) of the radiation-sensitive composition. The PEB temperature is preferably 30 to 200° C., and more preferably 50 to 170° C.

In order to bring out the potential of the radiation-sensitive composition to a maximum extent, an organic or inorganic anti-reflective film may be formed on the substrate, as disclosed in Japanese Examined Patent Publication (KOKOKU) No. 6-12452 (Japanese Patent Application Publication (KOKAI) No. 59-93448), for example. A protective film may be formed on the resist film so that the resist film is not affected by basic impurities, etc., contained in the environmental atmosphere, as disclosed in Japanese Patent Application Publication (KOKAI) No. 5-188598, for example. These methods may be used in combination.

The resist film thus exposed is developed to form a given resist pattern. The developer used for development is preferably an aqueous alkaline solution prepared by dissolving at least one alkaline compound (e.g., sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water.

The concentration of the aqueous alkaline solution is preferably 10 mass % or less. If the concentration of the aqueous alkaline solution exceeds 10 mass %, the unexposed area may also be dissolved in the developer. The pH of the developer is preferably 8 to 14, and more preferably 9 to 14.

An organic solvent may be added to the alkaline aqueous solution (developer), for example. Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methanol, ethanol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like. These organic solvents may be used either individually or in combination.

The organic solvent is preferably used in an amount of 100 parts by volume or less based on 100 parts by volume of the alkaline aqueous solution. If the amount of the organic solvent exceeds 100 parts by volume, the exposed area may remain undeveloped due to a decrease in developability. An appropriate amount of surfactant or the like may also be added to the alkaline aqueous solution (developer).

After developing the resist film using the alkaline aqueous solution (developer), the resist film may be washed with water, and dried.

EXAMPLES

Several embodiments of the invention are further described below by way of examples. Note that the invention is not limited to the following examples. In the following examples, the unit "parts" refers to "parts by mass" unless otherwise indicated.

[1] Synthesis of Monomer

Example 1

18.8 g of 3-methyl-1,3-butanediol, 23.8 g of 1-adamantane carbonyl chloride, and 11.1 g of pyridine were dissolved in 150 g of tetrahydrofuran. The mixture was reacted at room temperature for six hours. After completion of the reaction, ethyl acetate was added to the reaction solution, and the organic layer was washed with water. The organic layer was then purified by silica gel column chromatography using an ethyl acetate/n-hexane mixture (1/4 (volume ratio)) as an eluant to obtain a tertiary alcohol compound including an adamantane residue (yield: 80%).

The structure of the compound was determined by $^1$H-NMR ("JNM-ECA-400" manufactured by JEOL Ltd.). The following results were obtained.

$^1$H-NMR (400 MHz, DMSO-$d_6$, internal standard: TMS): δ (ppm)=1.00-1.10 (s, 6.0H), 1.50-1.70 (8.0H), 1.70-1.80 (6.0H), 1.85-2.00 (3.0H), 4.00-4.10 (t, 2.0H), 2.25-2.30 (s, 1.0H)

10 g of the tertiary alcohol compound, 4.7 g of methacrylic chloride, and 5.1 g of 1,4-diazabicyclo[2.2.2]octane were dissolved in methylene chloride, and reacted for four hours under reflux. After completion of the reaction, ethyl acetate was added to the reaction solution, and the organic layer was washed with water. The organic layer was then purified by silica gel column chromatography using an ethyl acetate/n-hexane mixture (1/4 (volume ratio)) as an eluant to obtain the target compound (yield: 70%).

The structure of the compound was determined by $^1$H-NMR ("JNM-ECA-400" manufactured by JEOL Ltd.). The following results were obtained.

$^1$H-NMR (400 MHz, DMSO-$d_6$, internal standard: TMS): δ (ppm)=1.35-1.50 (s, 6.0H), 1.50-1.69 (6.0H), 1.69-1.85 (9.0H), 1.85-2.00 (3.0H), 2.00-2.15 (t, 2.0H), 4.00-4.10 (t, 2.0H), 5.60-6.00 (2.0H)

It was thus confirmed that the structure of the compound is shown by the following formula. This compound is referred to as a compound (M-1-1).

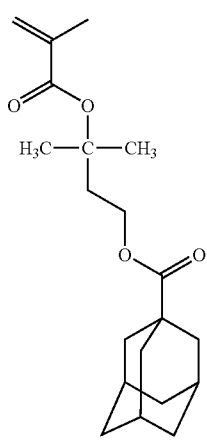

(M-1-1)

[2] Synthesis of Polymer

Example 2

140 g of p-acetoxystyrene, 80 g of the compound (M-1-1) obtained by Example 1, 8 g of azobisisobutylonitrile (AIBN), and 1 g of t-dodecylmercaptan were dissolved in 200 g of propylene glycol monomethyl ether, and polymerized at 70° C. for 16 hours in a nitrogen atmosphere. After completion of polymerization, the reaction solution was added dropwise to 10,000 g of n-hexane to coagulate and purify the copolymer. After the addition of 150 g of propylene glycol monomethyl ether to the copolymer, 300 g of methanol, 80 g of triethylamine, and 15 g of water were added to the mixture. The mixture was hydrolyzed for 8 hours under reflux at the boiling point. After completion of the reaction, the solvent and triethylamine were evaporated under reduced pressure. After dissolving the resulting copolymer in 220 g of acetone, the solution was added dropwise to 2000 g of water to coagulate the copolymer. A white powder thus produced was filtered, and dried at 50° C. overnight under reduced pressure.

The resulting copolymer had an Mw of 10,000 and an Mw/Mn ratio of 2.1. The molar ratio of the repeating units derived from p-hydroxystyrene and the repeating units derived from the compound (M-1-1) determined by $^{13}$C-NMR analysis was 75:25. This copolymer is referred to as a polymer (A-1).

The Mw and the Mn of the copolymer (A-1) were determined by gel permeation chromatography (GPC) using GPC columns (manufactured by Tosoh Corp., G2000HXL×2, G3000HXL×1, G4000HXL×1) (flow rate: 1.0 ml/min, eluant: tetrahydrofuran, column temperature: 40° C., standard: monodisperse polystyrene). The dispersibility (Mw/Mn) was calculated from the measurement results.

[3] Preparation of Radiation-Sensitive Composition

Examples 3 to 8

The polymer (A), the acid generator (B), the acid diffusion controller (C), and the solvent (D) were mixed in a ratio shown in Table 1. The resulting solution was filtered through a membrane filter (pore size: 200 nm) to obtain composition solutions (radiation-sensitive compositions) of Examples 3 to 8.

The details of the polymer (A), the acid generator (B), the acid diffusion controller (C), and the solvent (D) are given below.

Polymer (A)

(A-1): polymer (A-1) obtained in Example 2

Acid Generator (B)

(B-1): triphenylsulfonium trifluoromethanesulfonate (B-2): triphenylsulfonium nonafluoro-n-butanesulfonate (B-3): triphenylsulfonium 1,1,2,2-tetrafluoro-2-(tetracyclo[4.4.0.1$^{2,5}$.1$^{7,10}$]dodecan-8-yl)ethanesulfonate (B-4): triphenylsulfonium 1,1-difluoro-2-(bicyclo[2.2.1]heptan-2-yl)ethanesulfonate (B-5): compound shown by the following formula (2x-16)

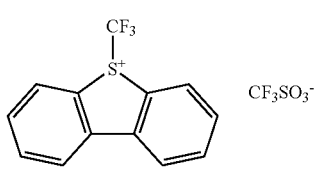

(2x-16)

Acid Diffusion Controller (C)
(C-1): tri-n-octylamine
(C-2): triphenylsulfonium salicylate
(C-3): N-t-butoxycarbonyl-2-phenylbenzimidazole
Solvent (D)
(D-1): ethyl lactate
(D-2): propylene glycol monomethyl ether acetate derived from the compound shown by the formula (M-2) determined by $^{13}$C-NMR analysis was 75:25. This copolymer is referred to as a polymer (A-2).

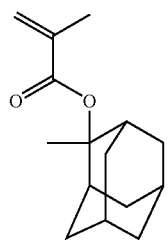

(M-2)

TABLE 1

|  | Polymer (A) | | Acid generator (B) | | Acid diffusion controller (C) | | Solvent (D) | |
|---|---|---|---|---|---|---|---|---|
|  | Type | Amount (parts) | Type | Amount (parts) | Type | Amount (parts) | Type | Amount (parts) |
| Example 3 | A-1 | 100 | B-1 | 9 | C-1 | 1 | D-1 | 1400 |
|  |  |  |  |  |  |  | D-2 | 3300 |
| Example 4 | A-1 | 100 | B-1 | 9 | C-2 | 1 | D-1 | 1400 |
|  |  |  |  |  |  |  | D-2 | 3300 |
| Example 5 | A-1 | 100 | B-2 | 9 | C-2 | 1 | D-1 | 1400 |
|  |  |  |  |  |  |  | D-2 | 3300 |
| Example 6 | A-1 | 100 | B-3 | 9 | C-2 | 1 | D-1 | 1400 |
|  |  |  |  |  |  |  | D-2 | 3300 |
| Example 7 | A-1 | 100 | B-4 | 9 | C-2 | 1 | D-1 | 1400 |
|  |  |  |  |  |  |  | D-2 | 3300 |
| Example 8 | A-1 | 100 | B-5 | 9 | C-3 | 1 | D-1 | 1400 |
|  |  |  |  |  |  |  | D-2 | 3300 |
| Comparative Example 1 | A-2 | 100 | B-1 | 9 | C-1 | 1 | D-1 | 1400 |
|  |  |  |  |  |  |  | D-2 | 3300 |

Comparative Example 1

(1) Synthesis of Polymer (A-2)

140 g of p-acetoxystyrene, 56 g of a compound (monomer) shown by the following formula (M-2), 8 g of AIBN, and 1 g of t-dodecylmercaptan were dissolved in 200 g of propylene glycol monomethyl ether. The mixture was polymerized at 70° C. for 16 hours in a nitrogen atmosphere. After completion of polymerization, the reaction solution was added dropwise to 10,000 g of n-hexane to coagulate and purify the copolymer. After the addition of 150 g of propylene glycol monomethyl ether to the copolymer, 300 g of methanol, 80 g of triethylamine, and 15 g of water were added to the mixture. The mixture was hydrolyzed for 8 hours under reflux at the boiling point. After completion of the reaction, the solvent and triethylamine were evaporated under reduced pressure. After dissolving the resulting copolymer in 200 g of acetone, the solution was added dropwise to 2000 g of water to coagulate the copolymer. A white powder thus produced was filtered, and dried overnight at 50° C. under reduced pressure.

The resulting copolymer had an Mw of 11,000 and an Mw/Mn ratio of 2.0. The molar ratio of the repeating units derived from p-hydroxystyrene and the repeating units (2) Preparation of Radiation-Sensitive Composition The polymer (A), the acid generator (B), the acid diffusion controller (C), and the solvent (D) were mixed in a ratio shown in Table 1. The resulting solution was filtered through a membrane filter (pore size: 200 nm) to obtain a composition solution (radiation-sensitive composition) of Comparative Example 1.

The details of the polymer (A), the acid generator (B), the acid diffusion controller (C), and the solvent (D) are given below.

Polymer (A)

(A-2): polymer (A-2)

Acid Generator (B)

(B-1): triphenylsulfonium trifluoromethanesulfonate

Acid Diffusion Controller (C)

(C-1): tri-n-octylamine

Solvent (D)

(D-1): ethyl lactate (D-2): propylene glycol monomethyl ether acetate

[4] Evaluation of Radiation-Sensitive Composition

Each composition solution (radiation-sensitive compositions of Examples 3 to 8 and Comparative Example 1) was spin-coated onto a silicon wafer using an instrument "Clean Track ACT-8" (manufactured by Tokyo Electron, Ltd.), and pre-baked (PB) under conditions shown in Table 2 to form a resist (radiation-sensitive composition) film having a thickness of 70 nm. The resist film was irradiated with electron beams using an electron beam drawing system ("HL800D" manufactured by Hitachi, Ltd., output: 50 KeV, current density: 5.0 A/cm$^2$). The resist film was then subjected to post-exposure bake (PEB) under conditions shown in Table 2. The resist film was then developed at 23° C. for 1 minute by a paddle method using a 2.38% tetramethylammonium hydroxide aqueous solution, washed with purified water, and dried to obtain a resist pattern. The resist thus obtained was evaluated by the following methods. The evaluation results of the radiation-sensitive compositions of Examples 3 to 8 and Comparative Example 1 are shown in Table 2.

(1) Sensitivity (L/S)

A dose at which a line-and-space pattern (1L1S) including a line area (width: 150 nm) and a space area (groove) (width: 150 nm) formed between the adjacent line areas was formed at a line width of 1:1 is defined as an optimum dose, and the sensitivity was evaluated based on the optimum dose.

Figure 2:
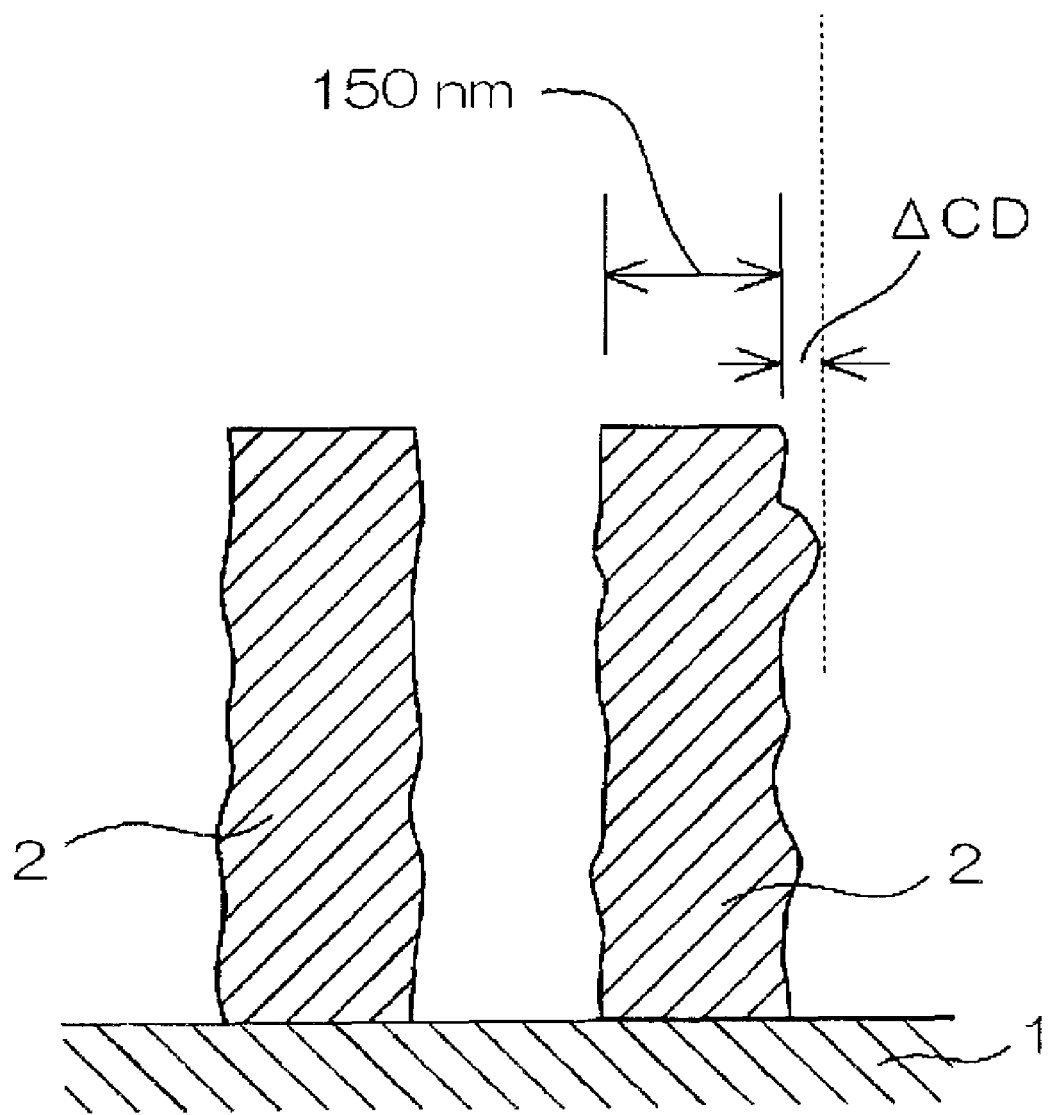
FIG. 2 is a cross-sectional view schematically showing the shape of a line pattern.

FIG. 1 is a plan view schematically showing the shape of the line-and-space pattern. FIG. 2 is a cross-sectional view schematically showing the shape of the line-and-space pattern. Note that elevations and depressions are exaggerated in FIGS. 1 and 2.

(2) Nano Edge Roughness

The line pattern of a line-and-space pattern (1L1S) (design line width: 150 nm) was observed using a scanning electron microscope ("S-9220" manufactured by Hitachi, Ltd.). The nano edge roughness was evaluated by determining a difference "ΔCD" between the design line width (150 nm) and the line width in an area where elevations and depressions significantly occurred along a side 2a of a line area 2 of a resist film formed on a silicon wafer 1 (see FIGS. 1 and 2) using a CD-scanning electron microscope (SEM) ("S-9220" manufactured by Hitachi High-Technologies Corporation).

(3) Resolution (L/S)

The minimum line width (nm) of a line pattern of a line-and-space pattern (1L1S) that was resolved at the optimum dose was taken as the resolution.

As shown in Table 2, it was confirmed that the radiation-sensitive compositions of Examples 3 to 8 including the polymer (A-1) obtained in Example 2 can produce a chemically-amplified positive-tone resist film that effectively responds to electron beams or extreme ultraviolet rays, shows only a small degree of roughness, exhibits excellent sensitivity, and accurately and stably produces a fine pattern, as compared with the radiation-sensitive composition of Comparative Example 1 including the polymer (A-2).

In the polymer according to the embodiment of the present invention, the repeating unit shown by the general formula (1) is a repeating unit shown by the following general formula (1-1),

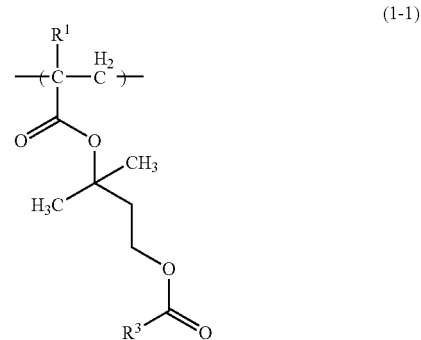

(1-1)

wherein R$^1$ represents a hydrogen atom or a methyl group, and R$^3$ represents a substituted or unsubstituted linear or branched monovalent alkyl group having 1 to 20 carbon atoms, an alicyclic group having 3 to 25 carbon atoms, or an aryl group having 6 to 22 carbon atoms.

The polymer according to the embodiment of the present invention further includes at least one of a repeating unit shown by the following general formula (2), a repeating unit shown by the following general formula (3), and a repeating unit shown by the following general formula (4),

TABLE 2

| | PB condition | | PEB condition | | | | |
|---|---|---|---|---|---|---|---|
| | Temperature (° C.) | Time (s) | Temperature (° C.) | Time (s) | Sensitivity (μC/cm$^2$) | Nano edge roughness (nm) | Resolution (nm) |
| Example 3 | 130 | 90 | 130 | 90 | 25.0 | 12 | 70 |
| Example 4 | 130 | 90 | 130 | 90 | 24.0 | 12 | 70 |
| Example 5 | 130 | 90 | 130 | 90 | 24.0 | 11 | 70 |
| Example 6 | 130 | 90 | 130 | 90 | 24.0 | 10 | 60 |
| Example 7 | 130 | 90 | 130 | 90 | 24.0 | 10 | 60 |
| Example 8 | 130 | 90 | 130 | 90 | 17.5 | 10 | 70 |
| Comparative Example 1 | 130 | 90 | 130 | 90 | 32.0 | 16 | 100 |

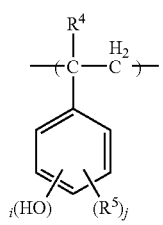

(2)

wherein $R^4$ represents a hydrogen atom or a methyl group, $R^5$ represents a hydrogen atom or a monovalent organic group, i is an integer from 1 to 3, and j is an integer from 0 to 3,

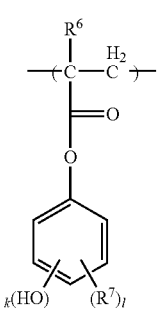

(3)

wherein $R^6$ represents a hydrogen atom or a methyl group, $R^7$ represents a hydrogen atom or a monovalent organic group, k is an integer from 1 to 3, and l is an integer from 0 to 3,

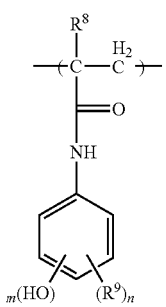

(4)

wherein $R^8$ represents a hydrogen atom or a methyl group, $R^9$ represents a hydrogen atom or a monovalent organic group, m is an integer from 1 to 3, and n is an integer from 0 to 3.

The radiation-sensitive composition according to the embodiment of the invention may produce a chemically-amplified positive-tone resist film that effectively responds to (extreme) deep ultraviolet rays (e.g., KrF excimer laser light, ArF excimer laser light, or EUV), X-rays such as synchrotron radiation, or electron beams, shows only a small degree of nano edge roughness, exhibits excellent etching resistance and sensitivity, and stably and accurately produces a fine pattern.

The above radiation-sensitive composition may be easily obtained using the polymer according to the embodiment of the invention as an acid-dissociable group-containing polymer.

Since the radiation-sensitive composition according to the embodiment of the invention exhibits high resolution when forming a line-and-space pattern and shows only a small degree of nano edge roughness, the radiation-sensitive composition may be useful when forming a fine pattern using EB, EUV, or X-rays. Therefore, the radiation-sensitive composition may be useful as a material for forming a chemically-amplified resist for producing semiconductor devices which are expected to be further scaled down in the future.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A polymer comprising:
   a repeating unit shown by a general formula (1-1); and
   a polystyrene-reduced weight average molecular weight determined by gel permeation chromatography (GPC) of 3000 to 100,000,

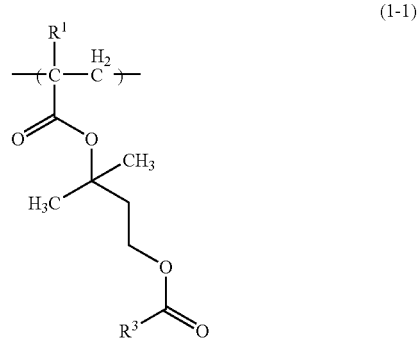

(1-1)

wherein $R^1$ represents a hydrogen atom or a methyl group, and $R^3$ represents a substituted or unsubstituted linear or branched monovalent alkyl group having 1 to 20 carbon atoms, an alicyclic group having 3 to 25 carbon atoms, or an aryl group having 6 to 22 carbon atoms.

2. A polymer comprising:
   a repeating unit shown by a general formula (1); and
   a polystyrene-reduced weight average molecular weight determined by gel permeation chromatography (GPC) of 3000 to 100,000,

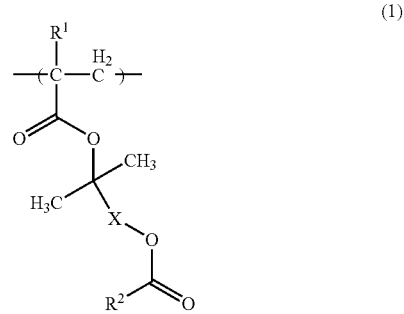

(1)

wherein $R^1$ represents a hydrogen atom or a methyl group, $R^2$ represents a substituted or unsubstituted linear or branched monovalent alkyl group having 1 to 20 carbon atoms, an alicyclic group having 3 to 25 carbon atoms, or an aryl group having 6 to 22 carbon atoms, and X represents a substituted or unsubstituted methylene group or a substituted or unsubstituted linear, branched or alicyclic hydrocarbon group having 2 to 25 carbon atoms, the polymer further comprising at least one of a repeating unit shown by a general formula (2), a repeating unit shown by a general formula (3), and a repeating unit shown by a general formula (4),

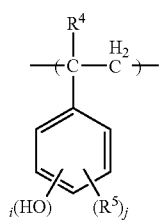

(2)

wherein $R^4$ represents a hydrogen atom or a methyl group, $R^5$ represents a hydrogen atom or a monovalent organic group, i is an integer from 1 to 3, and j is an integer from 0 to 3,

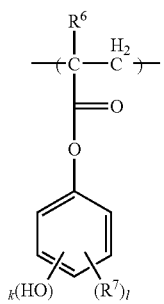

(3)

wherein $R^6$ represents a hydrogen atom or a methyl group, $R^7$ represents a hydrogen atom or a monovalent organic group, k is an integer from 1 to 3, and l is an integer from 0 to 3,

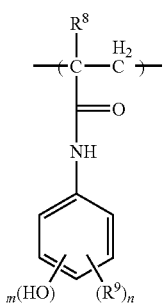

(4)

wherein $R^8$ represents a hydrogen atom or a methyl group, $R^9$ represents a hydrogen atom or a monovalent organic group, m is an integer from 1 to 3, and n is an integer from 0 to 3.

3. A radiation-sensitive composition comprising:
an acid-dissociable group-containing polymer that is insoluble or scarcely soluble in alkali and converted into alkali-soluble by an action of an acid, the acid-dissociable group-containing polymer comprising the polymer according to claim 1; and
a photoacid generator.

4. A monomer shown by a general formula (M 1-1),

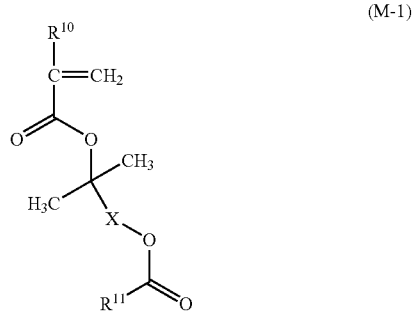

(M-1)

wherein $R^{10}$ represents a hydrogen atom or a methyl group, $R^{11}$ represents a substituted or unsubstituted linear or branched monovalent alkyl group having 1 to 20 carbon atoms, an alicyclic group having 3 to 25 carbon atoms, or an aryl group having 6 to 22 carbon atoms, and X represents ethylene.

5. The polymer according to claim 1, further comprising at least one of a repeating unit shown by a general formula (2), a repeating unit shown by a general formula (3), and a repeating unit shown by a general formula (4),

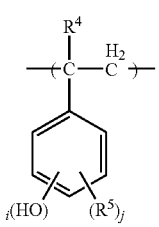

(2)

wherein $R^4$ represents a hydrogen atom or a methyl group, $R^5$ represents a hydrogen atom or a monovalent organic group, i is an integer from 1 to 3, and j is an integer from 0 to 3,

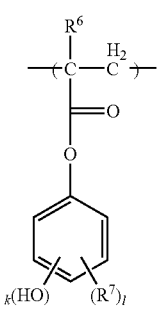

(3)

wherein $R^6$ represents a hydrogen atom or a methyl group, $R^7$ represents a hydrogen atom or a monovalent organic group, k is an integer from 1 to 3, and l is an integer from 0 to 3, (4)

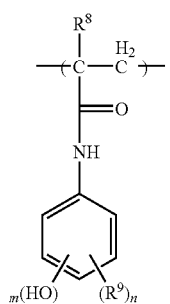

wherein $R^8$ represents a hydrogen atom or a methyl group, $R^9$ represents a hydrogen atom or a monovalent organic group, m is an integer from 1 to 3, and n is an integer from 0 to 3.

6. A radiation-sensitive composition comprising:
an acid-dissociable group-containing polymer that is insoluble or scarcely soluble in alkali and converted into alkali-soluble by an action of an acid, the acid-dissociable group-containing polymer comprising the polymer according to claim 2; and
a photoacid generator.

* * * * *